(12) United States Patent
Null

(10) Patent No.: US 12,704,572 B1
(45) Date of Patent: Aug. 11, 2026

(54) METHODS AND SYSTEMS FOR COMPUTING OPERATION EXECUTION INCLUDING FLUX FIELD STABILIZATION ENGINE

(71) Applicant: iQore, Inc., Lewes, DE (US)

(72) Inventor: Sean Null, Kansas City, MO (US)

( * ) Notice: Subject to any disclaimer, the term of this patent is extended or adjusted under 35 U.S.C. 154(b) by 0 days.

(21) Appl. No.: 19/186,010

(22) Filed: Apr. 22, 2025

(51) Int. Cl.
*G01R 33/389* (2006.01)

(52) U.S. Cl.
CPC .................................. *G01R 33/389* (2013.01)

(58) Field of Classification Search
CPC .. H03K 19/195; G01R 33/389; G06F 11/3003
See application file for complete search history.

(56) References Cited

U.S. PATENT DOCUMENTS 7,456,778 B2 11/2008 Werner et al.
7,577,203 B2 8/2009 Murugan et al.
7,680,226 B2 3/2010 Murugan et al.
7,702,085 B2 4/2010 Zumkeller et al.
8,886,497 B1 11/2014 Vold
9,143,039 B2 9/2015 Yang et al.
9,729,067 B2 8/2017 Yang et al.
9,858,237 B2 1/2018 Schnell
9,929,856 B1 3/2018 Berke et al.
10,230,304 B2 3/2019 Yang et al.
10,970,441 B1 4/2021 Zhang et al.
11,209,886 B2 12/2021 Hovis et al.
11,328,206 B2 5/2022 Chai et al.
11,531,385 B2 12/2022 Kim et al.
2020/0106445 A1 4/2020 Kerman
2021/0110260 A1 4/2021 Yoshiyama et al.
2022/0020913 A1 1/2022 Harris et al.
2023/0316117 A1 10/2023 Martinis et al.
2024/0036089 A1 2/2024 Li et al.
2025/0005412 A1 1/2025 Kim et al.
2025/0356235 A1* 11/2025 Hoskinson ............. G06N 10/40

FOREIGN PATENT DOCUMENTS

GB 2034944 A 6/1980
WO WO-2022228613 A1 * 11/2022 ............. G06N 10/40

OTHER PUBLICATIONS

Joo et al., "Magnetic-field-controlled reconfigurable semiconductor logic", Feb. 7, 2013, Nature vol. 494, pp. 72-76 (Year: 2013).*
Translation of WO 2022/228613 A1 (Year: 2022).*
Ansys, What is Signal Integrity?, Website Article, Ansys, Inc., United States. https://www.ansys.com/simulation-topics/what-is-signal-integrity#:~:text=A. Accessed Mar. 28, 2025.

* cited by examiner

*Primary Examiner* — Michael Maskulinski
(74) *Attorney, Agent, or Firm* — Losey PLLC

(57) ABSTRACT

A computing system and method include a processor including a circuit defining an execution pathway for movement of signals. The signals represent bits of the processor. A flux field stabilization engine is configured to model a flux field for each bit and adjust at least one parameter of the circuit based on the flux fields around the signals to at least one of maintain structured signal integrity, reduce signal interference, or reduce energy loss.

10 Claims, 4 Drawing Sheets

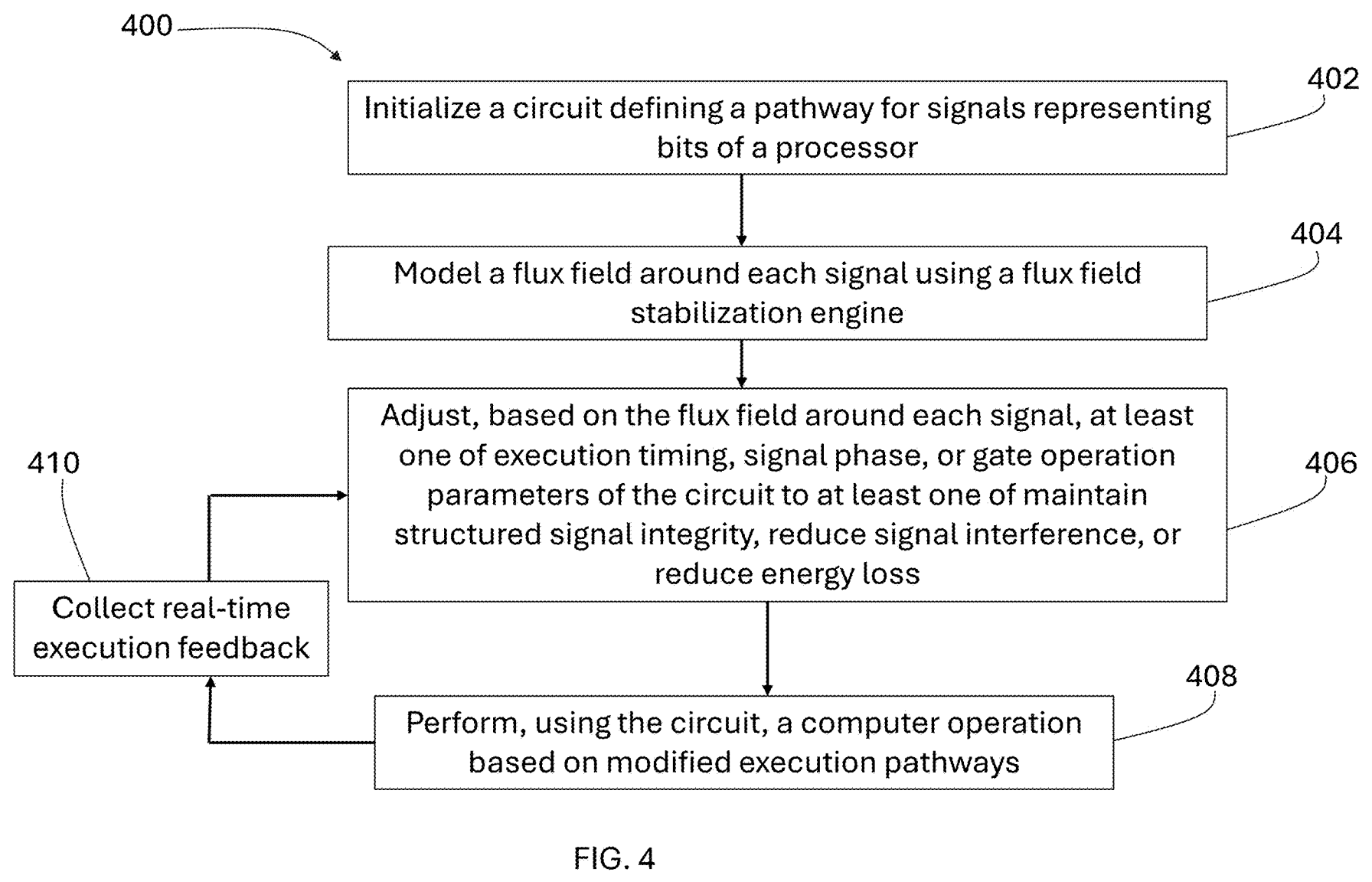

400

402 Initialize a circuit defining a pathway for signals representing bits of a processor 404 Model a flux field around each signal using a flux field stabilization engine 406 Adjust, based on the flux field around each signal, at least one of execution timing, signal phase, or gate operation parameters of the circuit to at least one of maintain structured signal integrity, reduce signal interference, or reduce energy loss 408 Perform, using the circuit, a computer operation based on modified execution pathways 410 Collect real-time execution feedback

FIG. 4

METHODS AND SYSTEMS FOR COMPUTING OPERATION EXECUTION INCLUDING FLUX FIELD STABILIZATION ENGINE

TECHNICAL FIELD

The field of the disclosure relates generally to computing systems and, more particularly, to computing systems including flux field stabilization engines.

BACKGROUND

Computing systems include processors that perform computer operations. For example, a processor generates and transmits signals that represent data as bits and move on an execution pathway involving logic gates (e.g., AND, OR, NOT) and other circuit functions (e.g. adders, multiplexers, flip-flops) to perform computer operations. The signals, which can be analog or digital, are transmitted through the computing system and/or to external components to process and store information for the computer operations. However, the signals are subject to interference (e.g., electromagnetic interference), disruption, and/or other effects that increase the processing time of the computing systems and/or introduce errors. Also, the signals lose energy due to heat, resistance, and interference during execution, which makes the computer operations slower and less efficient.

In addition, the computing systems may require additional power for the computer operations, which can lead to heat accumulation and further limit performance of the computing systems. For example, during a computer operation, the signals get weaker and noisier as the signals move through the circuits, and more power is needed to accommodate the loss of power by the signal. As power is added, heat builds up in the computing system and limits the performance. Additionally, the clock speed of the processor, which is directly related to processing speed, is limited by the heat generated by the processor. As a result, computing systems have longer processing times and are less efficient due to the environmental effects on the signals.

Existing technologies for computing systems have addressed some aspects of signal integrity, timing optimization, or dynamic circuit management using hardware or design modifications. However, the hardware or design modifications increase the complexity and cost of the computing systems and do not completely alleviate the issues. At least some computing systems reprocess data or provide error correction to further accommodate the issues.

The prevalence of computing systems means that reducing processing time even for simple computing systems used for everyday processing operations can have a massive impact. For example, consumers carry or have access to personal computing systems everywhere and rely on them for many aspects of their life. Providing faster and more accurate computing systems capable of near instantaneous computing processing would have profound effects on how humans receive, handle, and share information.

Therefore, there is a need for systems and methods that improve performance and reduce processing time of computing systems without requiring additional, complicated hardware.

BRIEF DESCRIPTION

In one aspect, a processor includes a circuit defining an execution pathway for movement of signals. The signals represent bits of the processor. The processor also includes a flux field stabilization engine configured to model a flux field around each signal that moves on the execution pathway, and adjust, based on the flux field around each signal, at least one of execution timing, signal phase, or gate operation parameters of the circuit to at least one of maintain structured signal integrity, reduce signal interference, or reduce energy loss.

In another aspect, a method of operating a processor includes initializing a circuit of the processor. The circuit defines an execution pathway for movement of signals. The signals represent bits of the processor. The method also includes modeling a flux field for each signal using a flux field stabilization engine, and adjusting, based on the flux field around each signal, at least one of execution timing, signal phase, or gate operation parameters of the circuit to at least one of maintain structured signal integrity, reduce signal interference, or reduce energy loss. The method further includes performing, using the circuit, a computing operation based on modified execution pathways.

In another aspect, a computing system includes a processor including execution pathways for signals to move on. The signals represent bits. The computing system also includes a flux field stabilization engine configured to model a flux field for each signal, and adjust, based on the flux field around each signal, at least one of execution timing, signal phase, or gate operation parameters of the execution pathways to at least one of maintain structured signal integrity, reduce signal interference, or reduce energy loss.

BRIEF DESCRIPTION OF THE DRAWINGS

FIG. 4 is a flow diagram of an example method of operating a computing system such as the computing systems shown in FIGS. 1-3.

Figure 1:
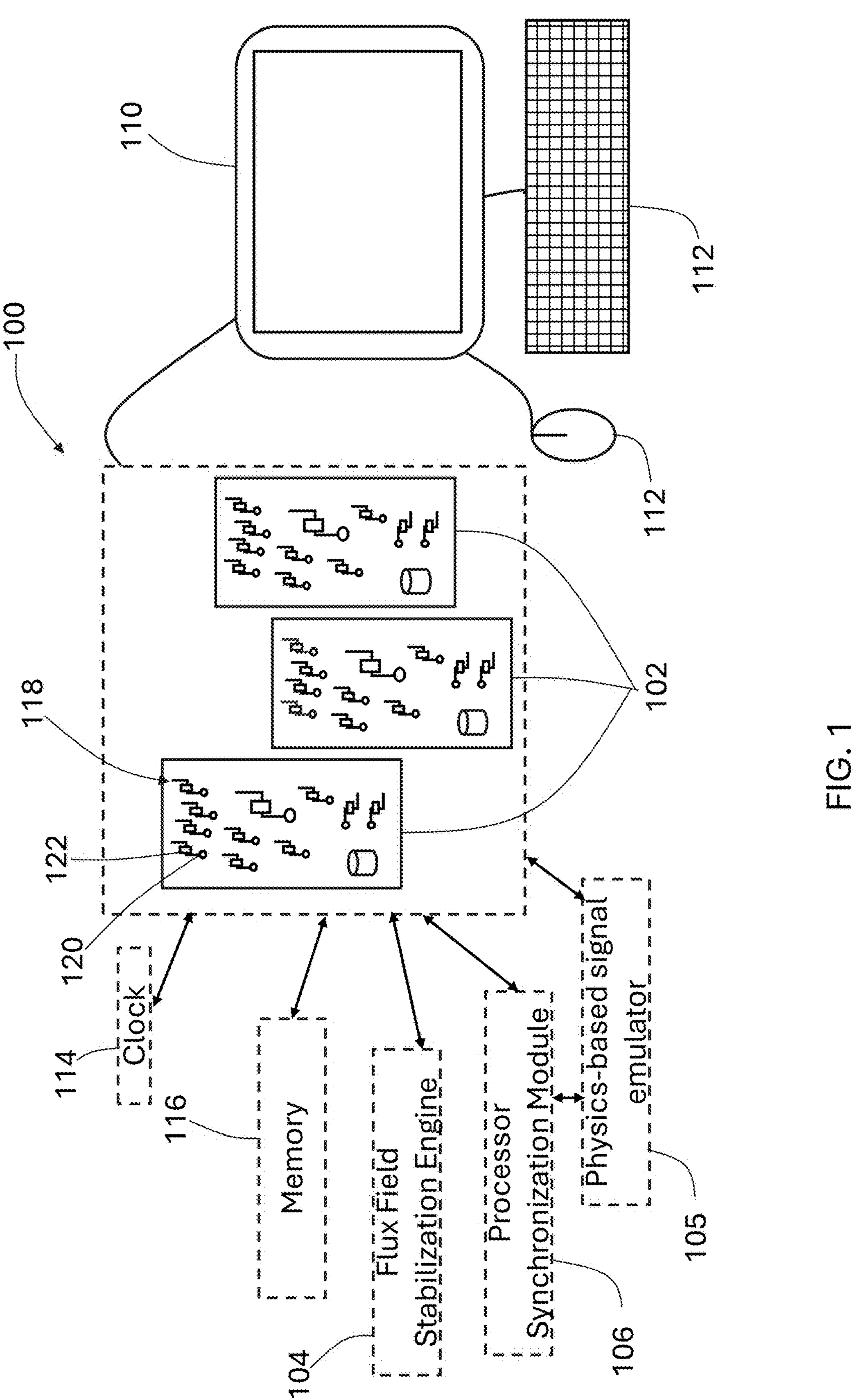
FIG. 1 is a partially schematic diagram of an example computing system including a flux field stabilization engine.

The figures depict embodiments for purposes of illustration only. One skilled in the art will readily recognize from the following discussion that other embodiments of the systems and methods illustrated herein may be employed without departing from the scope of the disclosure.

DETAILED DESCRIPTION

In an example, a computing system includes a flux field stabilization engine that actively manages signal behavior in real time and implements physics models (e.g., models of electromagnetic field behavior, including minute background fluctuations) to inform digital control strategies. The computing system includes digital circuit pathways (e.g. logic gates and interconnects carrying binary signals (bits)) augmented by the flux field stabilization engine. The flux field stabilization engine monitors the electromagnetic flux fields associated with each signal carried by the circuit pathways and uses artificial intelligence (AI) to dynamically adjust operating parameters for optimal performance and reliability of the computing system. For example, for every bit (signal) traveling through the circuit, the stabilization engine models a corresponding flux field. The modeled electromagnetic flux field represents the local energy state or electromagnetic environment of the signal. By modeling interactions between the fields of neighboring signals and environmental noise, the engine gains a physics-based view of signal integrity at any given time.

In addition, using AI-driven algorithms (including predictive and generative models), the flux field stabilization engine dynamically tunes execution parameters to maintain high signal integrity and energy efficiency. For example, the flux field stabilization engine can adjust gate timing, execution order, or routing pathways on the fly to reduce crosstalk and interference between signals. If the flux field stabilization engine predicts a potential error (such as a bit-flip or timing fault) based on flux field fluctuations, the flux field stabilization engine proactively modulates the operating conditions (clock timing, voltage, etc.) to prevent the error before it occurs.

The computing system leverages physics-augmented signal stabilization when the flux field stabilization engine aligns signal execution with underlying energy field patterns. By synchronizing logic operations with these "structured energy" fluctuations, the flux field stabilization engine operates the processor to suppress noise and signal drift (e.g. due to thermal or electromagnetic noise) without needing error-correcting retrials. Therefore, the computing system yields more reliable computation (fewer bit errors, less jitter) and improved energy usage than other computing systems. In examples, the flux field stabilization engine acts as an AI co-processor that continuously optimizes signal integrity and timing during operation and does not rely solely on static accommodation measures implemented only when the circuit is initially designed.

In examples, the flux field stabilization engine combines advanced AI-based control with physical field modeling to create a self-optimizing processor. The flux field stabilization engine continuously monitors bit-level signal conditions and adjusts the circuit's operation in real time to ensure signals propagate with minimal interference and energy loss. As a result, the computing system maintains high fidelity of bit states and efficient power usage during computation.

The flux field stabilization engine improves hardware performance of the computing system. For example, the flux field stabilization engine provides faster execution, lower power usage, and more stability beyond what traditional control loops achieve for computer processing. In addition, the computing system improves execution efficiency, reduces thermal bottlenecks, and increases system resilience to load fluctuations. Traditional systems do not recognize or appreciate the effect of vacuum fluctuations in circuits and do not incorporate AI models of vacuum fluctuation effects into, for example, a clocking or gating mechanism. Also, some traditional systems looked to eliminate electromagnetic interference at a circuit level by, for example, adding hardware shielding. The flux field stabilization engine models every level of fluctuations and interference for each individual signal. Modeling the minute flux interactions for every signal in the circuit unexpectedly enables the flux interactions to be structured and exploited to provide improved performance for the computing system. Also unexpectedly, the computing system maintains state fidelity without requiring additional logical bits by stabilizing flux states in real time. The computing system does not have to rely on error-correction redundancy or built-in static margins of error.

Other systems such as phase-locked loops (PLLs), error-correcting codes (ECC), and adaptive voltage scaling (AVS) focus on downstream signal correction or physical-layer adjustments. The systems and methods described herein perform real-time, predictive optimization using software-defined virtual field models that influence signal execution behavior before errors or instabilities occur. As used herein, the phrase "real-time" refers to at least one of the time of occurrence of the associated events, the time of measurement and collection of predetermined data, the time to process the data, and the time of a system response to the events and the environment. Real time feedback and operations occur within milliseconds of the occurrence of the associated event such that the feedback and operations are virtually instantaneous. As a result, the systems and methods dynamically improve performance of the systems as the systems operate.

The approach can be applied to different hardware forms such as general-purpose computer processing units (CPUs), application-specific integrated circuits (ASICs), field-programmable gate arrays (FPGAs)), and/or superconducting logic circuits.

FIG. 1 is a partially schematic diagram of an example computing system, generally indicated at 100. The computing system 100 is configured, for example, to perform computer operations. The computing system 100 includes at least one processor 102 and a flux field stabilization engine 104. The flux field stabilization engine 104 is a module implemented in hardware and/or software that monitors signal parameters and adjusts parameters of the processor 102. For example, the flux field stabilization engine 104 can be implemented via electronic circuitry, firmware and/or software instructions executed by a microcontroller, that perform the functions of the flux field stabilization engine 104. The flux field stabilization engine 104 operates the processors 102 as described below to, for example, enhance signal integrity or reduce energy loss when the processors 102 perform operations.

In addition, the computing system 100 may include any other components that facilitate the computing system 100 operating as described. For example, the computing system 100 includes a display device 110, an input device 112, and a memory 116. For example, the input device 112 may include a keyboard, a computer pointer device, a touch screen, a microphone, a camera, and/or any other suitable input device. In addition, the computing system 100 includes at least one timer 114 that provides timing for execution and synchronization. The computing system 100 may include more or less components in some examples.

The memory 116 may be any type of memory capable of use with the computing system 100. For example, the memory 116 may comprise, but is not limited to, volatile storage (e.g., random access memory), non-volatile storage (e.g., read-only memory), flash memory, or any combination of such memories. For example, computing system 100 may also include additional data storage media which may comprise devices (removable and/or non-removable) such as, for example, magnetic disks, optical disks, or tape. The memory 116 may include an operating system and one or more program modules or components suitable for performing the various described operations. The operating system may be suitable for controlling the operation of the computing system 100. In some examples, a portion of the memory 116 is stored on a database and accessed via a communication network (e.g., cloud storage).

As stated above, a number of program modules and data files may be stored in the memory 116. While executing on the processor 102, the program modules may perform the various processes including, but not limited to, the aspects of the computing system 100, as described herein. For example, aspects of the flux field stabilization engine 104 are stored on the memory 116 and accessed by the processors 102 when performing operations. The program modules may be incorporated into an operating system, application, middleware, and/or any other program module.

In the example, the computing system 100 includes a plurality of the processors 102 (e.g., a first processor, a second processor, a third processor, etc.). For example, each processor 102 may include one or more processing units, graphics units, communications units, system virtualization units and various application functionality all of which are integrated as a single integrated circuit or incorporated into multiple circuits.

Figure 2:
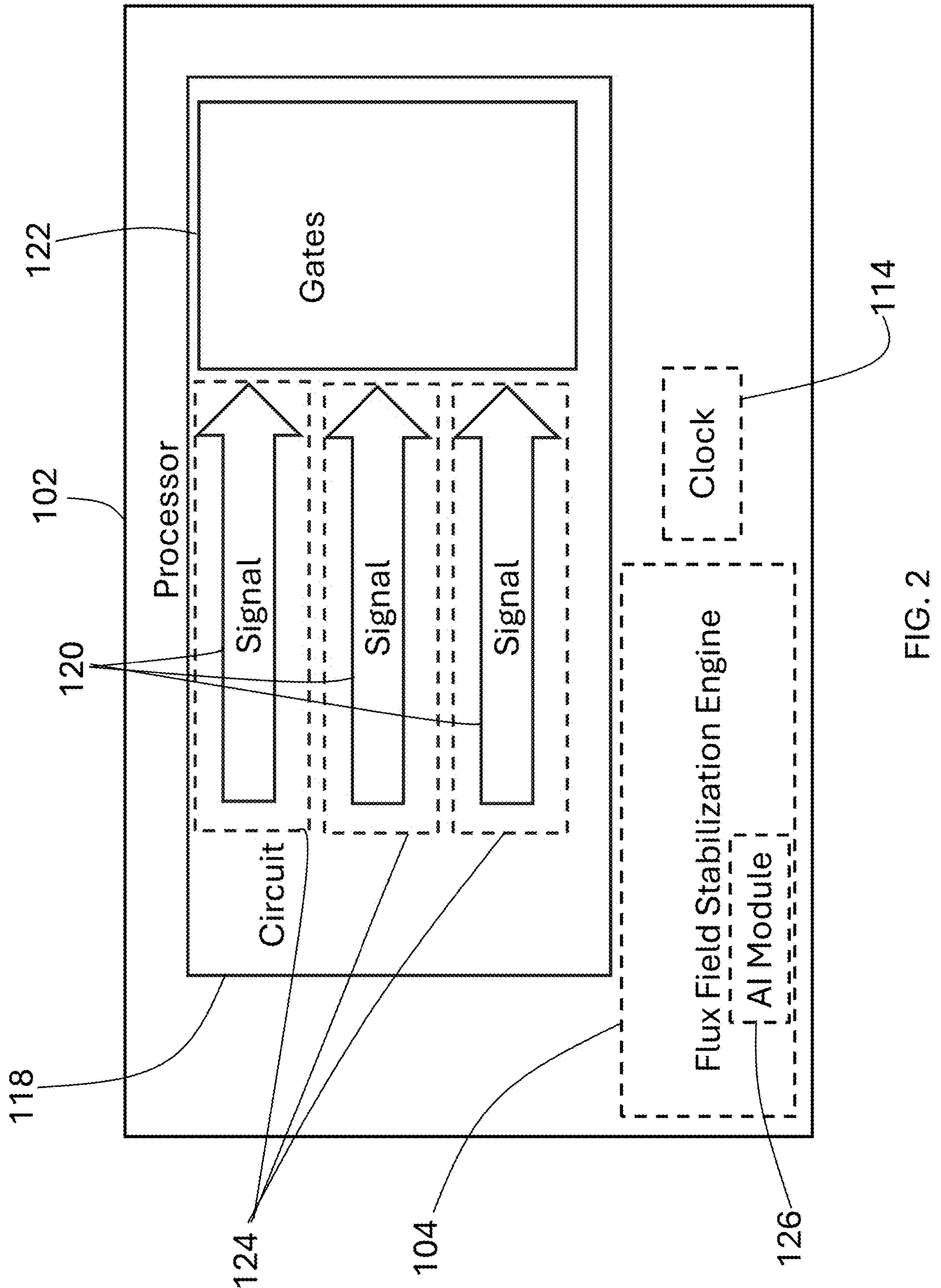
FIG. 2 is a block diagram of an example processor for use with the computing system shown in FIG. 1.
Figure 3:
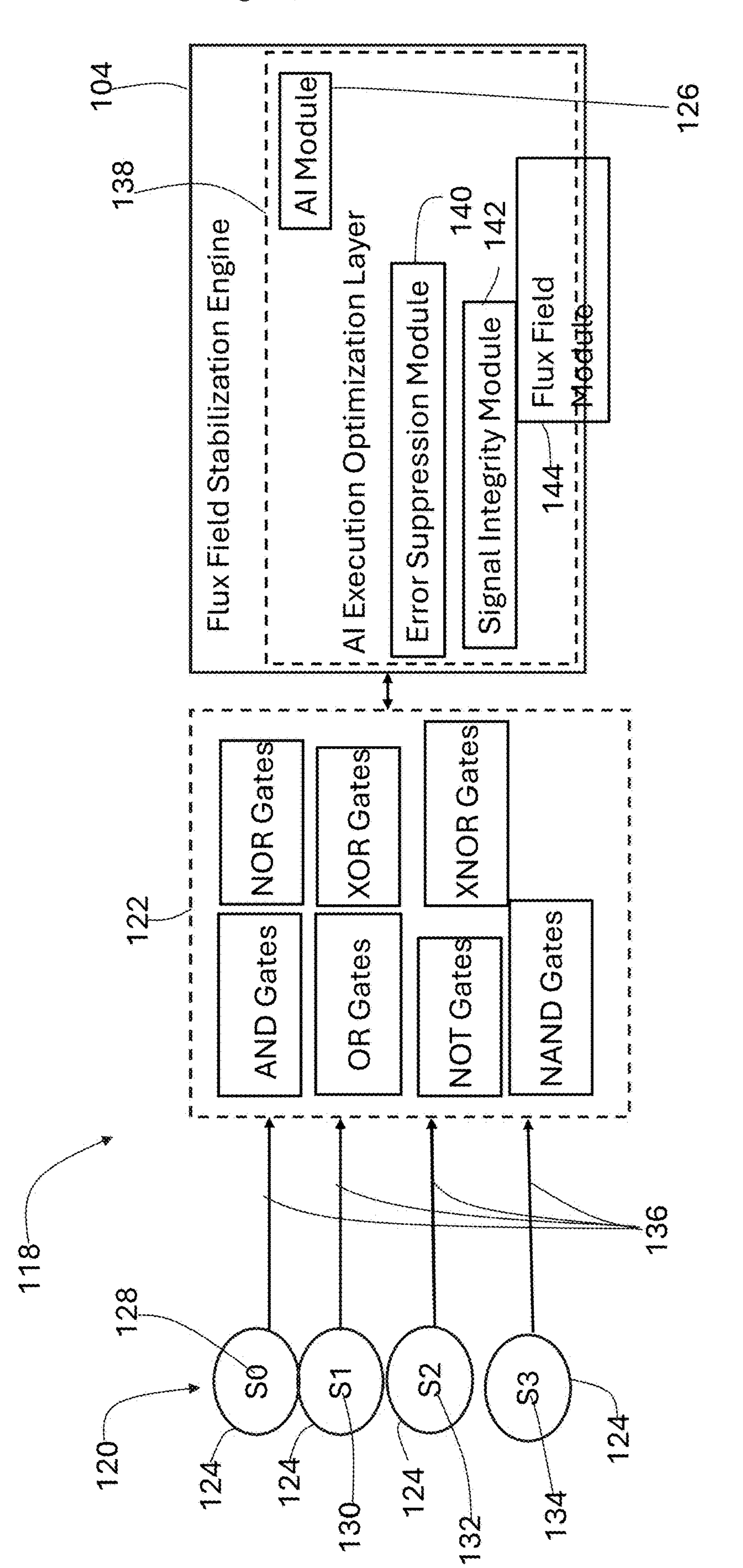
FIG. 3 is a partially schematic diagram of a portion of a circuit interacting with the flux field stabilization engine of the computing system shown in FIG. 1.

Also, in the example, each processor 102 includes at least one circuit 118 having gates 122 defining execution pathways for signals 120 representing bits. An example processor is illustrated in FIG. 2, and an example circuit is illustrated in FIG. 3. The gates 122 may be any gates suitable for computer operations. Examples of the gates 122 include, without limitation, AND, OR, NOT, NAND, NOR, XOR, and XNOR gates.

Referring to FIG. 1, in addition, the flux field stabilization engine 104 includes a software-defined flux energy execution modeling module that operates on the processors 102 and is configured to operate the circuits 118 to model a flux field for each signal 120. For example, the flux field stabilization engine 104 models flux fields associated with individual signals 120 that move on execution pathways in each processor 102 (e.g., a first flux field for a first signal, a second flux field for a second signal, a third flux field for a third signal, etc.). The flux field is a virtual field determined by the flux field stabilization engine 104 to represent the electromagnetic field (and associated energy distribution) generated by each signal 120 in each circuit 118, including any ambient or environmental field influences. The flux field for each signal 120 may be defined by a zone around the signal 120 bounded by one or more dimensions (e.g., a geometric shape having at least three dimensions and encompassing the signal 120 as the signal 120 moves) that is determined based on characteristics of the signal 120.

The flux field stabilization engine 104 identifies, structures, and manipulates the flux fields associated with the signals 120 and interactions with the flux fields to improve performance of the computing system 100. For example, the flux field stabilization engine 104 operates the processors 102 and optimize bits through structured flux field alignment to reduce interference among the flux fields, reduce signal noise, and reduce power consumption of the processors 102.

The electromagnetic flux fields are modeled based on a calculated effective flux experienced by each signal 120. For example, the calculated effective flux is determined by summing a nominal bit flux bias and weighted external noise sources. The flux fields are determined by equation Eq(1), where $\Phi_{eff}$ represents the effective flux experienced by the signal expressed in units of Tesla or Weber per square meter, $\Phi_0$ is the nominal bit flux bias of a baseline signal field expressed in units of Tesla, $N_i$ represents normalized external noise source i which is dimensionless, and wi represents AI trained weight for source i which is dimensionless.

$$\Phi_{eff} = \Phi_0 + \sum_{i=1}^{n} w_i * N_i \qquad \text{Eq(1)}$$

The flux field stabilization engine 104 calculates the flux for each signal 120 and associates the calculated effective fluxes with the locations of the respective signals 120 to generate the flux fields. The flux field stabilization engine 104 calculates an individual flux field for each signal 120. In examples, the flux fields for at least two of the signals 120 are different from each other. In some examples, the flux fields of each signal may differ from the flux fields of all other signals 120 in the system. The flux field stabilization engine 104 provides an improved precision and accuracy because the flux field stabilization engine 104 determines individual flux fields for each signal 120 independently. Based on the calculated effective fluxes experienced by the signals 120, the flux field stabilization engine 104 identifies interactions among the flux fields of the signals 120 and between the flux fields of the signals 120 and the environment around the signals 120.

Interactions within the flux fields of the signals 120 that move on the execution pathway produce effects on the signals 120 which can change operating conditions such as processing time, errors, and energy consumption. Also, the fluxes associated with the signals 120 exhibit resonant behaviors and when interacting with matter or other fields (magnetic fields, vacuum, gravity, etc.) can generate structures within the flux fields. For example, the flux field may comprise vacuum fluctuations. Vacuum fluctuations, as used herein, refers to small-scale transient electromagnetic field variations. The vacuum fluctuations are present even in ground-state circuits and can perturb signal stability. Forces such as the vacuum fluctuations interact with the environment and affect the signal 120 and cause loss of signal integrity of the signal 120. The flux field stabilization engine 104 accounts for the background fluctuations in modeling the flux fields. For example, the interactions are modeled by the flux field stabilization engine 104 in a structured energy field model. The structured energy field model includes an energy distribution for each signal 120. Based on the model, the flux field stabilization engine 104 imposes or identifies a pattern/structure in the energy distribution (flux field) and harnesses the structures to stabilize the signals 120. For example, the flux field stabilization engine 104 adjusts a parameter to impose a structured pattern onto fluctuations within the flux fields around the signals 120 and stabilize the signals 120. In addition, using the structured energy field model, the flux field stabilization engine 104 aligns the circuit's operation with an underlying modeled energy pattern to achieve stability.

The flux field stabilization engine 104 correlates the flux fields of the signals 120 to locations on the circuit(s) 118. For example, the flux field stabilization engine 104 is configured to generate a model of the circuit(s) 118 of the processor 102 to be used for a computer operation. The flux field stabilization engine 104 utilizes detailed layout data, representing the circuit's geometry and materials, to construct a precise virtual model including execution pathways. The flux field stabilization engine 104 then traces the signal paths through the execution pathways and correlates the signal locations with calculated flux values. The flux field stabilization engine 104 may utilize, in combination with described modeling, any suitable simulation technique. For example, the modeling may include aspects of finite element analysis, full-wave electromagnetic solvers, transient simulations, simulation program with integrated circuit emphasis, and/or any other simulation technique.

The flux field stabilization engine 104 calibrates and determines operating parameters for each processor 102 based on the modeled flux fields of signals 120. For example, the flux field stabilization engine 104 determines modifications to the execution pathways of the circuit 118 based on the modeled flux fields. Rather than relying on hardware modifications or other methods for static flux-bias calibration, the flux field stabilization engine 104 models the flux fields and facilitates the system accounting for and making dynamic real-time adjustments based on the flux fields for each signal 120 and the interactions with the flux fields.

The flux field stabilization engine 104 also acts as a predictive signal stabilization tool. For example, the system dynamically adjusts execution parameters based on modeled virtual fields, signal coherence, and time-dependent integrity forecasts. Instead of just reacting to errors after the errors occur, the flux field stabilization engine 104 models fluctuations in signal integrity and proactively adjusts operations to prevent loss of signal integrity before the loss of signal integrity manifests. The flux field stabilization engine 104 does not receive information from external sensors or physical field measurements and operates on an abstracted representation of the ambient energy field without physical field measurement or information from external sensors. The flux field stabilization engine 104 applies a virtualized field modeling process, in which structured background field interactions are simulated in real time. These interactions inform signal timing, coherence stability, and energy-efficient execution behavior. As a result, the system restructures execution timing dynamically based on predicted signal integrity loss and reduces error propagation in real time. For example, a representative function for AI-modeled signal stabilization is represented by equation Eq(2), where S(t) is the estimated signal integrity score at time t normalized for 0 to 1 or a percentage, $S_0$ is the initial baseline signal integrity (typically 1.0), and $\Delta S_{AI}(t)$ is the AI-predicted integrity degradation as a function of time based on field variability and modeled instability.

$$S(t) = S_0 - \Delta S_{AI}(t) \qquad \text{Eq(2)}$$

Also, the flux field stabilization engine 104 models the structure coherence of a signal pathway under simulated field interactions and facilitates the system anticipating optimal timing and energy retention conditions. Environmental fluctuations are accounted for through the predictive coherence modeling, which facilitates the flux field stabilization engine 104 adapting signal integrity thresholds dynamically over time. For example, equation Eq(3) represents a function for modeling the structured coherence of the signal pathway, where C(t) is the coherence value of a signal over time which is unitless and normalized, λ is the field-induced coherence decay rate in units per second ($s^{-1}$), w is the stabilized angular frequency representing oscillatory behavior of stabilized execution states in units of radians per second, and t is time.

$$C(t) = \exp(-\lambda t) * \cos(wt) \qquad \text{Eq(3)}$$

Using the predictive modeling, the flux field stabilization engine 104 facilitates signal integrity and execution timing remaining optimized across different hardware platforms.

The flux field stabilization engine 104 provides a software-defined execution framework that dynamically optimizes circuit execution by leveraging structured flux energy modeling, flux field stabilization, and signal integrity control. In some examples, at least a portion of the flux field stabilization engine 104 is incorporated into middleware that facilitates communication between an operating system and an application. For example, the middleware is implemented as a software exception layer that sits between an application layer and a hardware layer. Suitably, the flux field stabilization engine 104 is not bound to physical hardware but is compatible with different hardware to function as a transpilation, optimization, and/or execution enhancement middleware. In other examples, the flux field stabilization engine 104 is incorporated into a standalone application, an operating system, and/or any suitable platform. In some examples, operations of the flux field stabilization engine 104 are divided across middleware and execution level controls and/or are implemented in tightly integrated middleware and execution control packages. In further examples, the flux field stabilization engine 104 is not included in or does not interact with middleware.

The computing system 100 provides a physics-augmented execution validation framework. For example, a physics-based signal emulator 105 performs validation of the flux field stabilization engine 104. The physics-based signal emulator 105 is configured to simulate field-matter interactions across signal pathways. The physics-based signal emulator 105 reproduces energy field behavior under computational load, including flux-induced signal phase variations, coherence loss, and error propagation under variable execution timing. The physics-based signal emulator 105 evaluates signal-field interaction models using a multi-dimensional interference simulation framework, capable of supporting matrix-based calculations representing electromagnetic behavior across logic gate networks. In certain implementations, a virtual proof-of-function engine simulates signal propagation in structured energy fields, allowing assessment of error rates, entropy generation, coherence duration, and signal integrity under modeled environmental conditions.

This framework does not rely on quantum hardware and may be implemented on a classical processor. Simulations are conducted using high-fidelity numerical methods such as tensor-based modeling, Monte Carlo sampling, and phase coherence mapping to validate system performance under varying execution pathways. The physics-based signal emulator 105 may be incorporated into or coordinate with the flux field stabilization engine 104 and/or any other component of the computing system 100.

During operation, the flux field stabilization engine 104 performs an adaptive stability process for each signal 120 and applies flux energy principles to prevent loss of signal integrity. For example, the flux field stabilization engine 104 tracks and predicts interactions between the flux fields of the signals 120 and the flux fields of other signals 120, and/or between the flux fields of the signals 120 and the environment. Based on the recorded or predicted interactions, the flux field stabilization engine 104 adjusts operating parameters of the computing system 100 in real time to manipulate (e.g., reduce increase, or otherwise alter) the interactions between the flux fields of the signals 120 and the flux fields of other signals 120, and/or between the flux fields of the signals 120 and the environment. The operating parameters are adjusted to align execution with structured energy fluctuations for enhanced signal integrity, suppress errors before execution errors propagate, and/or prevent loss of signal integrity of the signals 120. Examples of operating parameters that can be adjusted include, without limitation, signal integrity states, execution order, gate operations, and execution pathways. The adjusted operating parameters provide executions with optimized interactions that improve performance of the processors 102.

For example, the flux field stabilization engine 104 dynamically adapts to circuit execution by applying real-time flux field corrections based on the state evolution of the signals 120. The flux field stabilization engine 104 continuously monitors signal integrity fluctuations and adjusts the flux field using adaptive pulse shaping to counteract phase noise, energy loss of the signals 120, and maintain signal integrity. For example, during operation, the flux field stabilization engine 104 generates an instantaneous flux gradient at every time step based on the flux fields. The instantaneous flux gradient may be calculated as a summation of the original or previous flux gradient added to a product of an adaptive energy gradient coefficient and fluctuations in the flux fields (calculated or measured). Then, a product of a correction factor for signal integrity loss and the rate of change of the fluctuation flux gradient is subtracted from the summation of the original flux gradient and the product of an adaptive energy gradient coefficient and fluctuations in the flux fields. The resulting value is recorded as the instantaneous flux gradient and is used to determine flux field corrections.

In some examples, the flux field stabilization engine 104 measures surrounding field gradients before execution to establish a baseline field intensity matrix including representations of flux intensity at each signal location. The flux field stabilization engine 104 detects phase distortions and/or flux field changes during execution and applies a corrective stabilization coefficient based on a dynamic compensation factor for the detected phase distortions. The corrective stabilization coefficient is multiplied by the sine of the product of the flux oscillation frequency and the time, and the resulting product is added to the baseline field intensity matrix. After execution, any residual loss of signal integrity is measured and the flux field stabilization engine 104 applies an adaptive backpropagation update for future executions. Accordingly, in some examples, the flux field stabilization engine 104 determines the baseline correction profile based at least partly on precomputed structured energy models and determines real-time flux measurements to provide dynamic corrections and respond instantly to the environmental noise in real-time.

The flux field stabilization engine 104 detects phase shifts in real-time and generates flux corrections within sub-microsecond latency using the described flux field modeling. As a result, the flux field stabilization engine 104 prevents loss of signal integrity before the loss of signal integrity propagates and preserves state fidelity without requiring additional logical bits. In examples, the flux field stabilization engine 104 leverages a precomputed flux field model for each signal 120 as a baseline and continuously refines predictions using real-time field measurements. In some such examples, the flux field stabilization engine 104 establishes an energy stabilization framework immediately prior to execution and continuously refines flux values based on evolving signal integrity conditions to improve execution speed and accuracy.

The flux field stabilization engine 104 models signal integrity fluctuations by analyzing interactions between bits and their surrounding energy environment. For example, the flux field stabilization engine 104 utilizes a three-layer predictive framework that integrates fluctuations, state evolution, and adaptive learning mechanisms. In layer one, the flux field stabilization engine 104 models the effect of energy fluctuations on signal phase stability. For example, the flux field stabilization engine 104 determines signal integrity decay patterns based on gate sequences. The flux field stabilization engine 104 adjusts or updates, in real-time, a Hamiltonian equation for the operation and the execution pathways to account for transient energy shifts. The adjustments may be inferred for each signal 120 individually or for one or more groups of the signals 120. The time dependent signal integrity losses for each signal 120 is multiplied by the number of signals 120 and then summed to obtain a total signal integrity loss. Then a model of the structured field adjustments is summed to obtain the total field adjustments. The base circuit Hamiltonian equation is adjusted by the total field adjustments and the total signal integrity loss to obtain an adaptive Hamiltonian equation, which is used in the further operations.

Layer two involves a state evolution prediction. The flux field stabilization engine 104 includes an artificial intelligence that trains on, for example, historical signal integrity loss data and uses the historical signal integrity loss data to predict upcoming phase shifts. Also, the flux field stabilization engine 104 uses a modeling technique to estimate signal integrity drift probability based on signal integrity decay rate.

In layer three, the flux field stabilization engine 104 dynamically adjusts the execution pathway before execution to mitigate signal integrity loss. In addition, the flux field stabilization engine 104 applies filtering such as Kalman filtering to refine error suppression over multiple executions. For example, the flux field stabilization engine 104 adjusts the execution pathway to accommodate a predicted phase drift. As a result, the flux field stabilization engine 104 prevents loss of signal integrity before the loss of signal integrity accumulates in multi-bit interactions.

In some examples, the flux field stabilization engine 104 is generally hardware agnostic and is compatible with a broad range of computing architectures including superconducting bit platforms and any processing units. For example, the flux field stabilization engine 104 applies software-driven resonance tuning among other features and, in some examples, adjusts dynamically based on hardware-specific error profiles. Execution parameters are modified at runtime based on modeled fields, not hardwired behavior. For example, the flux field stabilization engine 104 identifies the hardware platform and determines an error profile that is appropriate for the identified hardware. As such, the flux field stabilization engine 104 is simple and cost-effective to incorporate into or add to existing computing infrastructures.

In examples, at least a portion of the flux field stabilization engine 104 is implemented in different layers and/or components of the computing system 100 or auxiliary systems. For example, the flux field stabilization engine 104 may be implemented in an execution layer that interacts directly with the circuits 118. In one example, the flux field stabilization engine 104 utilizes hardware-embedded execution logic (e.g., field programmable gate arrays, application-specific integrated circuits, etc.) to process instructions. In another example, the flux field stabilization engine 104 is included on a self-contained control unit that pre-processes and optimizes execution without interfacing with external middleware. In some examples, aspects of the flux field stabilization engine 104 are incorporated into an on-chip control system that executes, optimizes, and stabilizes circuits. Such embodiments may operate without interfacing with middleware or requiring input from external sources.

Alternatively, at least some aspects of the flux field stabilization engine 104 are incorporated into offboard sources (e.g., cloud-based systems). For example, aspects of the flux field stabilization engine 104 may utilize cloud-based execution services that process and optimize tasks externally before sending instructions to hardware.

Also, the flux field stabilization engine 104 may rely on networked execution systems in which distributed nodes collaborate in execution without needing middleware coordination. In addition, a protocol for the flux field stabilization engine 104 may optimize and schedule jobs before they reach the processors 102.

In examples, aspects of the flux field stabilization engine 104 are implemented in various stages of processing and pre-processing bit operations. For example, the flux field stabilization engine 104 may introduce an error mitigation protocol at the execution level that dynamically corrects noise without needing middleware intervention. Also, the flux field stabilization engine 104 may use real-time signal integrity tracking built into the execution layer. Further, the flux field stabilization engine 104 may implement flux field stabilization techniques controlled directly by the execution layer.

Execution of the computing system 100 may be decentralized across multiple systems. For example, a blockchain-based execution layer may optimize and validate computations in a distributed network. Also, the computing system 100 may utilize peer-to-peer job execution and leverage execution-level consensus mechanisms. In other examples, the computing system 100 creates a tokenized execution framework that assigns tasks dynamically without a centralized system.

The computing system may have a networking stack where execution synchronization occurs in any layers. In other examples, the computing system may have a network or device-based execution system.

The processor synchronization module 106 is configured to synchronize operation of the processors 102 and dynamically adjusts computations in real time to minimize error accumulation, ensure high-fidelity results across interconnected processing units (CPUs), and deliver increased computational accuracy. The processor synchronization module 106 may be incorporated with the flux field stabilization engine 104 or may be a standalone module capable of operation without the flux field stabilization engine 104.

For example, the processor synchronization module 106 schedules execution pathways for the signals 120 and synchronizes clocks and signal transmission across CPUs. In addition, the processor synchronization module 106 manages communication and error handling across the CPUs. Also, the processor synchronization module 106 aggregates and merges measurement results into a unified output.

The computing system 100 may include one or more communication systems that enable communication by and between components of the computing system 100 and/or facilitate or otherwise enable the computing system 100 to communicate with remote computing devices. Examples of suitable communication connections include, but are not limited to, radio frequency (RF) transmitter, receiver, and/or transceiver circuitry, and/or universal serial bus (USB), parallel, and/or serial ports. Communication systems may also comprise physical ports (i.e., ethernet or fiber optic) or wireless antenna and supporting hardware which enable the computing system 100 to send or receive data over an internet connection. The communication systems may include a network that is wired and/or wireless and utilizes any suitable communication protocols including, but not limited to, internet, cellular, Wi-Fi, Bluetooth, near-field communication, or other wireless (or wired) communication protocols.

FIG. 2 is a block diagram of an example of one of the processors 102 for use with the computing system 100. The processor 102 includes the circuit 118 and the flux field stabilization engine 104 configured to operate the circuit 118. The circuit 118 defines an execution pathway for signals 120 representing bits of the processor 102. Each bit represents a unit of information for the processor 102 and has two states, represented by a "0" or a "1" in standard binary language. The operating states of the bits represent computing information and enable the bits to be used to perform computer operations. The bits can be grouped in sequences referred to as bytes, or in any other manner. For example, a byte is a sequence of 8 bits. The number of bits used to represent a value is referred to as bit-depth.

The execution pathway is formed at least partly by conductors 136 (shown in FIGS. 1 and 2) and is configured for electric current to flow through with selected voltages that define the signals 120. The signals 120 are provided, for example, within selected ranges of voltage or frequency to represent the bits.

The processor 102 processes information and performs operations by manipulating the operating status of the signals 120 representing the bits. For example, the processor 102 includes gates 122 that operate on the signals 120 and provide reversible logic transformations that act on the signals 120. The gates 122 each can act on one, two, or more of the signals 120. The gates 122 perform operations (e.g., Boolean operations) on the signals 120 to transform the bits represented by the signals 120. For example and without limitation, the gates 122 may include transistors such as metal-oxide-semiconductor field-effect transistors (MOSFETs). In further examples, the gates 122 include vacuum tubes, electromagnetic relays with relay logic, fluidic logic, pneumatic logic, optics, molecules, acoustics, mechanical or thermal elements, and/or any other transformation devices.

The flux field stabilization engine 104 models an optimal virtual flux field 124 around each signal 120 to ensure stability of the signal 120 and operates the circuit 118 to manipulate the flux fields 124 around the signals 120 using, for example, software-defined flux energy execution modeling. The flux field 124 may encompass, for example, a coherent electromagnetic field around the signal 120. The flux fields 124 are structured by optimizing electromagnetic and other interactions between the signals 120 and the surrounding energy fields during operations.

In addition, the flux field stabilization engine 104 manipulates the flux fields 124 in real time by dynamically tuning, for example, the execution parameters of the circuit 118 to compensate for energy fluctuations. The flux fields 124 remain structured during operations and prevent distortion due to the operations of the flux field stabilization engine 104. For example, the flux field stabilization engine 104 is configured to selectively control the gates 122 based on the flux fields 124 around the signals 120 to modulate the signals 120. Also, the flux field stabilization engine 104 is configured to determine a timing of the gates 122 that act on each signal 120 to reduce interference between the flux fields 124 of the signals 120. The reorganization and precise timing adjustments of the gates 122 based on the flux fields 124 cause controlled changes in how the signals 120 interact with the surrounding energy fields.

In some examples, the flux field stabilization engine 104 determines an operating status of each signal 120 or a predicted operating status of each signal 120. The flux field stabilization engine 104 then operates the processor 102 to manipulate the flux fields 124 based on the operating status of the signals 120 or the predicted operating status of the signals 120. For example, the operating status of the signals 120 or the predicted operating status of the signals 120 may relate to at least one of a loss of signal integrity, a predicted error rate, or experienced noise. The flux field stabilization engine 104 determines an operating parameter of the processor 102 based on the flux fields and the operating status of the signals 120 or the predicted operating status of the signals 120 to at least one of reduce interference among the flux fields, reduce noise, or reduce power consumption of the processor 102. In the example, the flux field stabilization engine is configured to modify an execution pathway of the circuit 118 to stabilize interactions with the flux field for each signal 120.

The flux field stabilization engine 104 includes an artificial intelligence (AI) module 126 that is configured to determine operating parameters of the processor 102 in real-time to further improve performance of the processor 102. In the example, the AI module 126 includes a generative AI platform designed to synthesize novel data or solutions based on learned patterns and constraints. Additionally or alternatively, the AI module 126 many employ any suitable AI platform(s). The specific AI platform(s) employed within the AI module 126 can be dynamically selected or combined based on the requirements of the processor 102, the nature of the input data, and the desired output characteristics. Examples of AI platforms that may be included in the AI module 126 include, without limitation, machine learning, neural networks, reinforcement learning, symbolic AI, hybrid AI platforms, and/or any other AI platforms. Further, the AI module 126 could be implemented using custom-designed AI platforms, tailored to the specific requirements of the flux field stabilization engine 104 and/or the processor 102.

The AI module 126 actively modifies execution pathways in real-time. For example, the flux field stabilization engine 104 is configured to predict a potential error and adjust at least one operating parameter of the processor 102 to reduce the opportunity for the error to occur. The AI module 126 may run simulations to predict the error and determine the best way to reduce the error based on the flux fields 124 of the signals 120. In addition, the flux field stabilization engine 104, using in some examples the AI module 126, is configured to predict loss of signal integrity of at least one signal 120 in real-time based on fluctuations in the flux fields 124 and adjust the operating parameters of the circuit 118 based on the predicted loss of signal integrity to reduce the opportunity for the loss of signal integrity to occur. The fluctuations in the flux fields 124 may be, for example, caused by changes in an operating status of the signal 120 based on interactions in the flux fields 124.

The AI module 126 of the flux field stabilization engine 104 facilitates the flux field stabilization engine 104 dynamically adjusting the processor 102 in real time to improve performance. For example, the AI module 126 provides optimized circuit execution by changing timing of the gates 122, adjusting inputs for the gates 122, and/or utilizing different combinations of logic gate operations. The AI module 126 determines AI-driven execution logic via modeled flux fields to dynamically improve performance. In addition, the flux field stabilization engine 104 provides an AI-powered self-calibrating execution system that continuously refines circuit parameters based on real-time execution feedback to improve overall stability. As a result, the flux field stabilization engine 104 enables circuits 118 to execute faster while maintaining an increased accuracy.

In examples, the AI module 126 of the flux field stabilization engine 104 is configured to generate modifications to operating parameters of the circuits 118 to improve performance of the circuits 118 based on the modeled flux fields without altering physical hardware. For example and without limitation, the modifications include signal timing adjustment, dynamic voltage and frequency scaling, digital signal processing for signal shaping, data encoding, software-controlled I/O impedance matching, gate scheduling and resource allocation, and software-controlled clock gating.

For example, the flux field stabilization engine 104 modifies signal phase relationships and clock skew through software-controlled digital delay lines or phase-locked loops (PLLs) within the model including the flux fields. The flux field stabilization engine 104 staggers signal transitions to manipulate the interactions within the flux fields and provide more efficient structures of the flux fields.

The flux field stabilization engine 104 assesses voltage and frequency requirements for different circuit sections and optimizes digital voltage and frequency scaling parameters based on the flux fields. The flux field stabilization engine 104 controls voltage regulators and clock generators to minimize power consumption while maintaining signal integrity. The flux field stabilization engine 104 adjusts voltage levels and clock frequencies dynamically to reduce power consumption and minimize noise during idle or low-activity periods. In addition, the flux field stabilization engine 104 reorganizes gate scheduling and the sequence of logical operations and data flow within the circuit by, for example, reordering the instructions for the processor to run the gates based on the flux fields.

The AI module 126 of the flux field stabilization engine 104 employs optimization algorithms, such as genetic algorithms, gradient descent, or particle swarm optimization, to explore the design space of these software-driven modifications. Machine learning techniques, such as reinforcement learning or supervised learning, are incorporated to refine optimization strategies based on the modeled flux fields. The flux field stabilization engine 104 generates optimized software parameters, which are then validated through further modeling, to ensure compliance with performance and reliability specifications.

In some examples, the flux field stabilization engine 104 includes a compiler that analyzes the circuits 118 to implement aspects of the flux field stabilization engine 104. For example, the compiler translates the modifications output by the AI module 126 and/or other modules based on the flux field modeling into annotations or directives to change the original execution pathways. For example, the compiler provides precise instructions to implement adjustments, based on the electromagnetic flux field around each signal, to at least one of execution timing, signal phase, or gate operation parameters. For example, for execution timing, instructions such as "DELAY_MICROSECONDS (register, delay_value)" create software-controlled delays by triggering internal timers, and enable precise timing adjustments based on the flux field modeling. Instructions such as "WAIT_FOR_EVENT (event_flag)" pause execution until a specified event occurs, facilitating synchronization based on the flux modeling. Signal phase adjustments are possible with instructions such as "PHASE_SHIFT (output_pin, phase_offset)" or "SET_CLOCK_PHASE (clock_select, phase_offset)", which communicate with hardware modules such as digital phase-locked loops to control signal phase. Gate operation parameters, such as voltage levels, are adjusted using instructions such as "SET_VOLTAGE (voltage_domain, voltage_level)", which control voltage regulators for dynamic voltage scaling. Clock frequencies can be adjusted with instructions such as "SET_CLOCK_FREQUENCY (clock_domain, frequency)". The instructions are determined based on the information from the modeling of the flux fields and are implemented to structure the flux fields and improve performance of the processor without requiring hardware modifications.

In addition, the compiler identifies opportunities to operate the gates 122 in a way that clusters idle periods for the signals 120. By clustering idle times, the flux field stabilization engine 104 can schedule protective measures during the intervals to reduce errors and/or stabilize the signals 120. In addition, the compiler maps operations on the signals 120 to physical locations based on noise or flux parameters at the physical location. For example, on a superconducting processor, operations at the edges of a chip may experience less interference from cross-talk, and operations located near a cavity in the chip may be protected from interference. The compiler uses calibration data and determines noise spectra of each physical circuit location. The compiler maps logical signal operations with heavy workloads to the locations that fit best based on the noise profile at the physical locations. The compiler may work across a single processor, or across multiple processors in a multi-CPU system. In the multi-CPU system, the compiler maps the operations to locations in the logic based on considerations such as the noise profiles at physical locations on different processors.

The compiler outputs a circuit such as the circuit shown in FIG. 3. In some examples, the compiler outputs annotations or directives that are interpreted by other layers of the flux field stabilization engine 104 and implemented during operation of the computer.

In examples, the compiler is at least partly within the execution layer, within middleware layers, and/or is within any operating layer. For example, the compiler may be an execution-level compiler that pre-processes circuits before running them on hardware and uses a real-time circuit adaptation engine that translates high-level programs directly into hardware-native instructions.

FIG. 3 is a partially schematic diagram of a portion of an example processor including a circuit 118. The circuit 118 defines an execution pathway for movement of signals 120 representing bits of the circuit. In the example, the circuit 118 includes four of the signals 120 (e.g., a first signal 128, a second signal 130, a third signal 132, and a fourth signal 134). In other examples, the circuit 118 can include more or less than four of the signals 120.

The circuit includes gates 122 and conductors 136. The gates 122 facilitate state changes of the signals 128, 130, 132, and 134. For example, the gates 122 perform operations such as AND, OR, NOT, NAND, NOR, XOR, and XNOR operations on the bits.

The conductors 136 define a pathway for the signals 128, 130, 132, and 134. The conductors 136 include any suitable material and are constructed in any suitable manner. For example and without limitation, the conductors 136 may be constructed of metal (e.g., copper, aluminum, gold, silver, or iron), alloys (e.g., brass or steel), and/or other conductive materials (e.g., carbon, conductive polymers, or electrolytes). The conductors 136 may be printed, drawn, and/or fabricated on a substrate and/or or otherwise formed to define the pathway.

While not necessarily shown in the FIG. 3, the circuit 118 may also include resistors, capacitors, and/or any other circuit components.

The flux field stabilization engine 104 is configured to interact with the circuit 118. In the example, the flux field stabilization engine 104 includes an AI execution optimization layer 138 encompassing an error suppression module 140, a signal integrity module 142, a flux field module 144, and an AI module 126. The AI execution optimization layer 138 actively modifies execution pathways in real-time based on modeling generated by the AI module 126. In some examples, the AI execution optimization layer 138 includes a feedback loop to provide continual or incremental signal integrity adjustments. In the example, the modules 140, 142, 144, 126 of the AI execution optimization layer 138 are operable across deterministic classical compute architectures.

The flux field module 144 determines individual flux fields for each of the signals 128, 130, 132, and 134. For example, the flux field module 144 calculates instantaneous fluxes associated with each of the signals 128, 130, 132, and 134 and tracks the instantaneous fluxes to the location of the signals 128, 130, 132, and 134 at the respective times. Also, the flux field module 144 determines interactions or potential interactions between the signals 128, 130, 132, and 134 and/or surrounding energy fields and the flux field stabilization engine 104 operates the circuit 118 to manipulate the interactions. The flux field module 144 sends or otherwise provides the determined flux fields to the error suppression module 140, the signal integrity module 142, and/or any other module. In some examples, the flux field module 144 provides additional modeling and/or estimation. For example, the flux field module 144 performs coherence estimation to determine coherence of the signals 128, 130, 132, and 134 based on the flux fields.

The error suppression module 140 monitors the operating status of the signals 128, 130, 132, and 134 to identify potential for phase errors. The error suppression module 140 determines operating parameters to accommodate the operating status of the signals 128, 130, 132, and 134 and suppress any potential error. The error suppression module 140 operates in real-time and dynamically adjusts operating parameters to suppress the errors before or during the execution of the circuit 118. Moreover, the error suppression module 140 may be located entirely onboard the processor or computing system. Accordingly, the system is not dependent on offboard error correction. In some examples, the error suppression module 140 provides flux-based error suppression. For example, the error suppression module 140 identifies potential errors induced by flux of the signals 128, 130, 132, and 134 and/or determines corrections for errors based on the flux of the signals 128, 130, 132, and 134. As a result, the error suppression module 140 optimizes volume and suppresses error accumulation dynamically via structured flux signal integrity modeling.

The signal integrity module 142 determines operating parameters of the circuit 118 that facilitate stability of the signals 128, 130, 132, and 134 and/or reduce errors. For example, the signal integrity module 142 prevents loss of signal integrity of the signals 128, 130, 132, and 134 by determining an operating status of each of the signals 128, 130, 132, and 134 based on the modeled fluxes and predicting loss of signal integrity of any of the signals 128, 130, 132, and 134 based on the operating status. The signal integrity module 142 determines corrections or modifications of the execution pathways to prevent or reduce the opportunity for loss of signal integrity and the signal integrity module 142 applies in real-time the signal corrections to the signals based on structured execution modeling. For example, the signal integrity module 142 adjusts phase, frequency, and integrity parameters of the signals based on virtual coherence projections. In addition, the signal integrity module 142 performs adaptive signal routing and may modify the signal routes in real-time based on the flux fields.

The flux field stabilization engine 104 utilizes an AI module 126 that facilitates the flux field stabilization engine 104 determining and adjusting parameters of the circuit 118 in real-time based on the flux fields. The AI module 126 includes a prediction unit. For example, the AI module 126 in coordination with the error suppression module 140 and the signal integrity module 142 runs simulations based on the flux fields and the possible operations of the circuit 118 to predict interactions that cause loss of signal integrity, and/or errors. For example, the AI module 126 generates an AI-based model of execution-layer signal interactions using the modeled electromagnetic flux fields around the signals, and modifies execution-layer signal interactions based on the artificial Intelligence-based model of the execution-layer signal interactions. The flux field stabilization engine 104 determines operating parameters that synchronize the timing and operation of the gates 122 to reduce the likelihood of loss of signal integrity, and/or errors and improve performance of the circuit 118.

The AI module 126 utilizes any suitable training database. For example, the AI module 126 may be trained using a database of possible circuit designs, circuit design standards, information on available gates and logic operations, and any other suitable information. In addition or alternatively, the AI module 126 may utilize machine learning. For example, the AI module 126 may store, evaluate, and learn from circuit operations modeled and/or implemented during operation. The AI module 126 may compare parameters for different models based on the flux field information received from the modules 140, 142, 144 and select optimal structures based on the comparison. For example, the AI module 126 can utilize an inference model including predictive analytics and decision making. In addition, the AI module 126 can utilize feedback-based adaptive correction, and/or reinforcement learning.

In an example, the AI module 126 includes an AI-enhanced circuit transpiler that leverages machine learning techniques to optimize and adapt circuit representations for specific hardware architectures based on information from the modules 140, 142, 144. The AI module 126 acts as an intelligent intermediary, translating a high-level circuit description into a low-level, executable form. The AI module 126 implements, in real-time, parameters and modifications provided by the modules 140, 142, 144 into a reorganized circuit without changing the hardware layout of the circuit.

For example, during operation the AI module 126 analyzes and learns the specific capabilities and limitations of the target hardware (e.g., gate delays in a classical ASIC). For example, the Ai module 126 identifies factors such as available gate sets, and interconnect limitations.

Through machine learning, the AI module 126 develops and refines optimization strategies for circuit transformation by exploring possible circuit mappings and identifying circuit maps that minimize resource usage and improve performance. The AI module 126 iteratively improves the process using techniques like reinforcement learning.

The AI module 126 adapts to dynamic operational conditions, such as fluctuations in signal integrity or changes in hardware availability. For example, the AI module 126 makes real-time adjustments to gate scheduling or resource allocation.

The AI module 126 learns to automatically decompose complex gates provided by flux modeling into simpler, native gates supported by the target hardware. For example, the AI module 126 determines optimal sequences of native gates that minimize circuit depth and gate count. Furthermore, the AI module 126 leans to synthesize new gate combinations based on desired functionality, hardware constraints, and the modeled flux fields.

Using the flux field models, the AI module 126 incorporates knowledge of noise models and error characteristics to optimize circuits for robustness. The AI module 126 learns and applies noise-aware gate scheduling, and/or dynamic modification of circuit layouts to minimize the impact of noise identified in the flux field models.

The AI module 126 predicts the performance of a transpiled reorganized circuit on the target hardware, enabling the transpiler to make informed optimization decisions. The AI module 126 validates the correctness and functionality of the transpiled reorganized circuit through simulation or hardware testing. Also, the AI module 126 identifies recurring patterns in circuit structures and learns effective heuristics for circuit transformation.

During operation, the circuit 118 receives a command for a computational operation. The computational operation includes a series of gate operations and timing that define execution pathways for the bits (represented physically by signals) for performing the computational operation. The flux field module 144 determines flux fields for each bit and evaluates predicted interactions that will occur within the flux fields based on projected execution pathways. For example, the flux field module 144 performs calculations to determine a flux for each individual signal and maps the fluxes to tracings of the respective signals. In some examples, the flux field module 144 models flux interactions for each bit without defining a specific field around each signal. For example, the flux field module 144 may determine a generic flux profile that applies to the bits and may determine interactions based on the profiles. Alternatively, the flux field module 144 may store and retrieve information representing standard flux interactions associated with specific operations on execution pathways and insert the information into the model to determine the interactions. In such examples, the flux field module 144 may sacrifice some precision and performance improvement capability to provide simplified calculations.

The flux field stabilization engine 104 projects execution pathways for the signals 128, 130, 132, and 134. The execution pathways include operations of the gates 122 and cause the flux fields of at least some of the signals 128, 130, 132, and 134 to intersect with each other. The flux field stabilization engine 104 recognizes the identified intersections and determines if the intersections would result in unwanted or inefficient interactions between the signals 128, 130, 132, and 134. For example, the interactions can cause loss of signal integrity or instability of at least one of the signals 128, 130, 132, and 134, may introduce opportunity for errors, and/or may slow down the processing operations.

If the flux field stabilization engine 104 determines that the interactions are undesired or sub-optimal, the flux field stabilization engine 104 adjusts the timing and/or operation of the gates 122 to prevent or manipulate the interactions of the determined flux fields of the signals 128, 130, 132, and 134. The flux field stabilization engine 104 provides modified execution pathways based on the adjustments to the timing and/or operation of the gates 122. The circuit 118 performs the operations using the modified execution pathways. As a result, the flux field stabilization engine 104 improves performance of the circuit 118.

In one example, when a request for a computation is received, the signals 128, 130, 132, and 134 are initialized in states selected based on the computation requirements. The flux field stabilization engine 104 applies a structured alignment of the flux fields of the signals 128, 130, 132, and

134 to stabilize the initial states. The flux field stabilization engine 104 adjusts operating parameters to ensure each signal 128, 130, 132, and 134 starts with minimal initial loss of signal integrity. Also, the signal integrity module 142 of the flux field stabilization engine 104 adjusts operating parameters based on characteristics of the signals 128, 130, 132, and 134 to ensure that the signals 128, 130, 132, and 134 initiate in a low-noise, stable, and flux-aligned state. Further, the signal integrity module 142 adjusts frequencies of the signals 128, 130, 132, and 134 to prevent early phase drift.

After initialization, the gates 122 are applied to the signals 128, 130, 132, and 134. The timing and the ordering of the gates 122 are dynamically optimized to maximize signal integrity. In real-time and during operation, the error suppression module 140 detects fluctuations in stability and corrects minor phase deviations of the signals 128, 130, 132, and 134. The structured energy alignment of the flux fields reduces energy leakage from interactions of the signals 128, 130, 132, and 134 during executions. Also, the error suppression module 140 minimizes gate-induced noise and reduces the need for additional error-correcting bits.

The signal integrity module 142 facilitates maintaining long-term signal integrity by counteracting normal signal fidelity degradation over time. For example, the signal integrity module 142 realigns phase interactions and applies structured flux interactions to reduce integrity loss. As a result, the signal integrity module 142 maintains strong integrity. In addition, the signal integrity module 142 compensates for loss of signal integrity over time.

The circuit 118 generates a final measurement and readout optimization when the computations are complete. The signals 128, 130, 132, and 134 are measured for data extraction. The flux field stabilization engine 104 optimizes the measurement process to reduce any interference from the measurement or errors in measurement. For example, before measurement, the signal integrity module 142 applies final signal integrity corrections to reduce measurement noise.

FIG. 4 is a flow diagram of an example method 400 of operating a processor (e.g., the processor 102 shown in FIG. 2) of a computing system (e.g., the computing system 100 shown in FIG. 1). For example, a non-transitory computer-readable medium stores instructions that, when executed by a processor, cause the processor to perform the method 400. Referring to FIGS. 1-4, the method 400 includes initializing 402 a circuit (e.g., the circuit 118) defining a pathway for movement of signals (e.g., signals 120) representing bits of a processor.

In the method 400, a flux field stabilization engine (e.g., the flux field stabilization engine 104) models 404 a flux field (e.g., the flux field 124) for each signal. The flux fields are determined and structured to enhance signal integrity and reduce energy loss of the processor. For example, the flux field stabilization engine utilizes a computational model that simulates structured flux fields without physical circuit modification. The flux field stabilization engine maps the flux fields to individual signals as the signals move on the execution pathways and the flux field stabilization engine models interactions based on the flux fields.

After generating the models, the flux field stabilization engine adjusts 406, based on the electromagnetic flux field around each signal, at least one of execution timing, signal phase, or gate operation parameters (e.g., gate sequencing, threshold voltage levels, drive strength, power supply voltage, loading, etc.) of the circuit to at least one of maintain structured signal integrity, reduce signal interference, or reduce energy loss. For example, the flux field stabilization engine determines interactions between the flux fields around the signals and modifies an execution pathway of the circuit to stabilize the interactions. For example, the flux field stabilization engine selectively reorganizes the order of gates that perform transformations on the bits based on the flux fields around the signals and adjusts a timing of gates for each bit to reduce interference between the flux fields of the bits. In some examples, the flux field stabilization engine operates the circuit to deliver adjustments to one or more of the flux fields.

In some examples, the flux field stabilization engine determines an operating status of the signals or a predicted operating status of the signals and adjusts at least one operating parameter of the circuit based on the state of the signals or the predicted state of the signals. For example, the state of the signals or the predicted state of the signals relates to at least one of a loss of signal integrity, an error rate, or noise. The flux field stabilization engine predicts loss of signal integrity of at least one bit in real-time based on fluctuations in the flux fields and modulates the flux fields based on the predicted loss of signal integrity to reduce the opportunity for the loss of signal integrity to occur.

Also, in the method 400, the circuit performs 408 a computer operation based on modified execution pathways. The flux field stabilization engine facilitates the computer operation and ensures that the bits are operating efficiently while performing the operation. For example, the flux field stabilization engine determines execution pathways that perform the computer operation and maintain the flux fields and desired interactions within a desired range of fluctuations to reduce error rates, increase signal integrity time, and improve execution speeds when the circuit performs the operations.

While the circuit performs 408 the computer operation, the flux field stabilization engine collects 410 real-time execution feedback. In the example, the flux field stabilization engine operates on an abstracted representation of the ambient energy field, for example, to determine real-time feedback and does not require physical field measurement or external sensors. In other examples, sensors may provide real-time information to the flux field stabilization engine. Alternatively or additionally, an AI module of the flux field stabilization engine may monitor performance indicators of the circuit through information generated during operation of the circuit. The flux field stabilization engine returns to adjusting 406 operation parameters and updates the execution pathways in real-time based on the execution feedback. In some examples, the AI module updates models of the flux fields for each signal in real-time based on the execution feedback.

NUMBERED EXAMPLES

Example 1. A processor comprising: a circuit defining an execution pathway for movement of signals, wherein the signals represent bits of the processor; and a flux field stabilization engine configured to: model a flux field around each signal that moves on the execution pathway; and adjust, based on the flux field around each signal, at least one of execution timing, signal phase, or gate operation parameters of the circuit to at least one of maintain structured signal integrity, reduce signal interference, or reduce energy loss.

Example 2. A processor in accordance with example 1, wherein the flux field stabilization engine is configured to determine a predicted operating status of at least one of the signals and adjust at least one operating parameter of the circuit based on the predicted operating status of the at least one of the signals.

Example 3. A processor in accordance with example 2, wherein the predicted operating status of the at least one of the signals relates to at least one of a loss of signal integrity, an error rate, or noise.

Example 4. A processor in accordance with example 1, further comprising logic gates that perform transformations on the signals on the execution pathway, and wherein the flux field stabilization engine is configured to selectively adjust timing of the logic gates based on the modeled flux fields to maintain signal integrity.

Example 5. A processor in accordance with example 4, wherein the flux field stabilization engine is configured to determine a timing of the logic gates to reduce interference between the flux fields of the signals.

Example 6. A processor in accordance with example 1, wherein the flux field stabilization engine is configured to: generate an artificial Intelligence-based model of execution-layer signal interactions using the modeled flux fields around the signals; and modify execution-layer signal interactions based on the artificial Intelligence-based model of the execution-layer signal interactions.

Example 7. A processor in accordance with example 1, wherein the flux field stabilization engine includes a generative artificial intelligence that is configured to predict a potential error and adjust at least one operating parameter of the processor to reduce an opportunity for the potential error to occur.

Example 8. A processor in accordance with example 1, wherein the flux field stabilization engine is configured to: predict loss of signal integrity of at least one signal in real-time based on fluctuations in the flux fields; and modulate the flux fields based on the predicted loss of signal integrity to reduce an opportunity for the loss of signal integrity to occur.

Example 9. A processor in accordance with example 1, wherein the flux field stabilization engine adjusts the parameter to impose a structured pattern onto fluctuations within the flux fields around the signals and stabilize the signals.

Example 10. A processor in accordance with example 9, wherein the flux fields are modeled based on a calculated effective flux experienced by the signal, wherein the calculated effective flux is determined by summing a nominal bit flux bias and weighted external noise sources.

Example 11. A method of operating a processor, the method comprising: initializing a circuit of the processor, the circuit defining an execution pathway for movement of signals, wherein the signals represent bits of the processor; modeling a flux field for each signal using a flux field stabilization engine; adjusting, based on the flux field around each signal, at least one of execution timing, signal phase, or gate operation parameters of the circuit to at least one of maintain structured signal integrity, reduce signal interference, or reduce energy loss; and performing, using the circuit, a computer operation based on modified execution pathways.

Example 12. A method in accordance with example 11, further comprising determining a predicted operating status of at least one of the signals based on the flux fields and modulating at least one operating parameter of the circuit based on the predicted operating status of the at least one of the signals.

Example 13. A method in accordance with example 12, wherein the predicted operating status of the at least one of the signals relates to at least one of a loss of signal integrity, an error rate, or noise.

Example 14. A method in accordance with example 11, further comprising selectively controlling, via the flux field stabilization engine, logic gates that perform transformations on the signals based on the flux fields around the signals.

Example 15. A method in accordance with example 14, further comprising determining a timing of the gates to reduce interference between the flux fields of the signals.

Example 16. A method in accordance with example 11, further comprising: modeling interactions between the flux fields around the signals; and modifying an execution pathway of the circuit to stabilize interactions in the flux field for each signal based on the interactions.

Example 17. A method in accordance with example 16, further comprising: predicting loss of signal integrity of at least one bit in real-time based on fluctuations in the flux fields; and modulating the flux fields based on the predicted loss of signal integrity to reduce an opportunity for the loss of signal integrity to occur.

Example 18. A non-transitory computer-readable medium storing instructions that, when executed by a processor, cause the processor to perform the method of example 11.

Example 19. A computing system comprising: a processor including execution pathways for signals to move on, the signals representing bits; and a flux field stabilization engine configured to: model a flux field for each signal; and adjust, based on the flux field around each signal, at least one of execution timing, signal phase, or gate operation parameters of the execution pathways to at least one of maintain structured signal integrity, reduce signal interference, or reduce energy loss.

Example 20. A computing system in accordance with example 19, wherein the flux field stabilization engine comprises an AI module that includes a prediction unit, a flux field module that performs coherence estimation, and a signal integrity module that performs adaptive signal routing, and wherein the AI module, the flux field module, and the signal integrity module are operable across deterministic classical compute architectures, wherein the flux field stabilization engine is configured to: perform structured execution modeling; generate signal coherence predictions, time-dependent integrity forecasts, and virtual coherence projections; dynamically adjust execution parameters based on the virtual flux fields, the signal coherence predictions, and the time-dependent integrity forecasts; apply in real-time signal corrections to the signals based on the structured execution modeling; and adjust phase, frequency, and integrity parameters of the signals based on virtual coherence projections.

Example 21. A computing system in accordance with example 19, further comprising a simulation module configured to emulate electromagnetic field interactions associated with execution pathways; model signal integrity variations due to structured energy fluctuations; and validate performance parameters of the flux field stabilization engine through non-hardware-based execution simulations using physics-derived virtual models.

The described systems and methods provide technical advantages and improve the technology of computing systems. For example, computing systems and methods are described which increase signal integrity, reduce error rates, and improve power efficiency of computing systems. For example, the described systems and methods include a flux field stabilization engine that adjusts operating parameters of the computing system in real time to manipulate, reduce, or increase the interactions of the flux fields and thereby reduce interference among the flux fields, reduce signal noise, and/or reduce power consumption of a processor of the computing system. The described systems and methods are compatible with a broad range of computing architectures including superconducting bit platforms, processing units, and other computing platforms. The described systems and methods may be incorporated into or added to existing computing infrastructures without additional hardware requirements. The described systems and methods increase the capacity of the computing by providing more efficient operation and enhanced capabilities of the processors.

Unlike traditional techniques that respond to signal degradation after the fact, described systems and methods predict and stabilize signal behavior in advance or real-time using virtualized modeling layers. This offers a proactive, software-first alternative to hardware error correction, voltage scaling, or PLL-type synchronization.

As will be appreciated based on the foregoing specification, the above-described embodiments of the disclosure may be implemented using computer programming or engineering techniques including computer software, firmware, hardware or any combination or subset thereof, wherein the technical effect is to provide enhanced computing. Any such resulting program, having computer-readable code means, may be embodied or provided within one or more computer-readable media, thereby making a computer program product, (i.e., an article of manufacture), according to the discussed embodiments of the disclosure. As used herein, the terms "computer-readable media" or "non-transitory computer-readable media" is intended to be representative of any tangible computer-based device implemented in any method of technology for short-term and long-term storage of information, such as, computer-readable instructions, data structures, program modules and sub-modules, or other data in any device. Therefore, the methods described herein may be encoded as executable instructions embodied in a tangible, non-transitory, computer-readable medium, including, without limitation, a storage device and/or a memory device. Such instructions, when executed by a processor, cause the processor to perform at least a portion of the methods described herein. Moreover, as used herein, the terms "computer-readable media" or "non-transitory computer-readable media" includes all tangible, computer-readable media, including, without limitation, non-transitory computer storage devices, including without limitation, volatile and non-volatile media, and removable and non-removable media such as firmware, physical and virtual storage, CD-ROMS, DVDs, and any other digital source such as a network or the Internet, as well as yet to be developed digital means, with the sole exception being transitory, propagating signal.

These computer programs (also known as programs, software, software applications, "apps", or code) include machine instructions for a programmable processor, and can be implemented in a high-level procedural and/or object-oriented programming language, and/or in assembly/machine language. As used herein, the terms "machine-readable medium" "computer-readable medium" refers to any computer program product, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The "machine-readable medium" and "computer-readable medium," however, do not include transitory signals. The term "machine-readable signal" refers to any signal used to provide machine instructions and/or data to a programmable processor.

When introducing elements of the present disclosure, the articles "a", "an", "the" and "the" are intended to mean that there are one or more of the elements. The terms "comprising", "including" and "having" are intended to be inclusive and mean that there may be additional elements other than the listed elements. Moreover, the use of "top", "bottom", "above", "below" and variations of these terms is made for convenience, and does not require any particular orientation of the components.

As various changes could be made in the above without departing from the scope of the disclosure, it is intended that all matter contained in the above description and shown in the accompanying drawings shall be interpreted as illustrative and not in a limiting sense.

What is claimed:

1. A method of operating a processor, the method comprising:

initializing a circuit of the processor, the circuit defining an execution pathway for logic operations of the processor;

determining flux fields associated with the execution pathway using a flux field stabilization engine, wherein each flux field represents an energy distribution including vacuum fluctuations;

determining a coherence value based on the flux fields;

determining, based on the coherence value and the flux fields associated with the execution pathway, adjustments to at least one of execution timing, phase, or gate operation parameters of the circuit to at least one of reduce noise experienced by the processor, reduce interference among the flux fields, or reduce energy loss from the processor;

generating a modified execution pathway based on the adjustments; and performing, using the circuit, a computer operation based on the modified execution pathway.

2. The method in accordance with claim 1, further comprising selectively controlling, via the flux field stabilization engine, logic gates that perform transformations along the modified execution pathway based on the flux fields.

3. The method in accordance with claim 2, further comprising determining a timing of the logic gates to reduce interference between the flux fields.

4. The method in accordance with claim 1, further comprising modeling interactions between the flux fields, wherein the modified execution pathway of the circuit is determined to stabilize the interactions in the flux fields.

5. The method in accordance with claim 1, further comprising:

determining, via the flux field stabilization engine, a timing of logic gates on the execution pathway;

selectively adjusting the timing of the logic gates to reduce interference between the flux fields; and performing, using the logic gates, transformations along the modified execution pathway according to the adjusted timing.

6. The method in accordance with claim 1, further comprising:

predicting, using a generative artificial intelligence, a potential error based on the flux fields; and adjusting at least one operating parameter of the processor to reduce an opportunity for the potential error to occur.

7. The method in accordance with claim 1, further comprising:

performing structured execution modeling using the flux field stabilization engine, wherein the flux field stabilization engine comprises an AI module that includes a prediction unit and a flux field module that performs coherence estimation;

generating coherence predictions, time-dependent integrity forecasts, and virtual coherence projections;

dynamically adjusting execution parameters based on the flux fields, the coherence predictions, and the time-dependent integrity forecasts;

applying, in real-time, corrections to the execution pathway based on the structured execution modeling; and adjusting phase, frequency, or integrity parameters of the execution pathway based on the virtual coherence projections.

8. The method in accordance with claim 1, further comprising:

modeling the flux fields based on a calculated effective flux, wherein the calculated effective flux is determined by summing a nominal bit flux bias and weighted external noise sources; and adjusting, using the flux field stabilization engine, an operating parameter of the circuit based on the flux fields to impose a structured pattern onto fluctuations within the flux fields and stabilize the execution pathway.

9. The method in accordance with claim 1, wherein the method is performed without using quantum hardware.

10. The method in accordance with claim 1, further comprising correlating the flux fields to physical locations on the circuit.

* * * * *